United States Patent [19]
Alexandres

[11] Patent Number: 5,229,566
[45] Date of Patent: * Jul. 20, 1993

[54] PROCESS AND APPARATUS FOR SPOT-WELDING A FLEXIBLE WELDING BOARD TO A BATTERY CELL

[75] Inventor: Richard B. Alexandres, Clear Lake, Iowa

[73] Assignee: Alexander Manufacturing Company, Mason City, Iowa

[*] Notice: The portion of the term of this patent subsequent to Jun. 29, 2010 has been disclaimed.

[21] Appl. No.: 619,520

[22] Filed: Nov. 29, 1990

[51] Int. Cl.5 .............................................. B23K 11/10
[52] U.S. Cl. ................................... 219/86.1; 29/623.1; 228/901
[58] Field of Search ............... 219/86.9, 87, 86.1; 228/58, 901; 429/121, 122, 186; 29/623.1, 623.3, 623.4

[56] References Cited

U.S. PATENT DOCUMENTS

| | | | |
|---|---|---|---|
| 2,667,526 | 1/1954 | Stumbock | 29/623.1 |
| 3,339,169 | 8/1967 | Freeland | 429/121 |
| 3,462,577 | 8/1969 | Helms et al. | 219/78 |
| 3,558,848 | 1/1971 | Width | 219/87 |
| 3,810,790 | 5/1974 | Denis | 219/117 |
| 3,942,704 | 3/1976 | Eberle | 228/58 |
| 4,069,079 | 1/1978 | Eggert | 29/623.4 |
| 4,253,232 | 3/1981 | Bennett et al. | 29/623.1 |
| 4,322,597 | 3/1982 | Hooke | 228/58 |
| 4,778,479 | 10/1988 | Römling et al. | 29/623.1 |
| 4,920,019 | 4/1990 | Stoklosa et al. | 429/122 |

FOREIGN PATENT DOCUMENTS

| | | | |
|---|---|---|---|
| 58-103775 | 6/1983 | Japan | 29/623.1 |
| 1488116 | 10/1977 | United Kingdom | 29/623.1 |
| 2121559 | 12/1983 | United Kingdom | 228/901 |

Primary Examiner—Geoffrey S. Evans
Attorney, Agent, or Firm—Hugh D. Jaeger

[57] ABSTRACT

Process for spot-welding a flexible welding board to at least one and preferably a battery cells to form a battery pack, such as a NiCad battery pack. The flexible welding board is a nickel alloy material, laminated to a polyester film by a co-extruded adhesive. The spot-welding is accomplished by one spot-welder, and preferably two spot-welders, which spot-weld in alternating time intervals so as to assure electrical and electromechanical contact with each end of the battery cells by the nickel alloy material. The spot-welding is by DC current and voltage. The electrodes are small enough to form a configuration between the flexible circuit and the end of the battery cell. Three spot-welding electrodes would assume a triangular configuration. Four spot-welding electrodes would form a rectangular configuration.

12 Claims, 3 Drawing Sheets

PROCESS AND APPARATUS FOR SPOT-WELDING A FLEXIBLE WELDING BOARD TO A BATTERY CELL

CROSS REFERENCES TO CO-PENDING APPLICATIONS

This patent application is related to co-pending patent application Ser. No. 07/618,454, filed Nov. 27, 1990, entitled "Flexible Welding Board for Battery Pack", to the same assignee as the present patent application.

BACKGROUND OF THE INVENTION

1. Field of the Invention

The present invention is for spot-welding, and more particularly, pertains to spot-welding of a nickel alloy flexible welding board to battery cells.

2. Description of the Prior Art

Battery packs, such as NiCad battery packs, in the past have been manufactured by welding stainless steel straps or nickel straps between battery cells, which is expensive in time and motion by an individual, requiring the individual welding of each battery cell for connection by stainless steel straps or nickel straps.

The present invention overcomes the disadvantages of the prior art by providing a flexible welding board which, can be spot-welded directly to the battery cells, and particularly, lends itself to robotic manufacturing processes.

SUMMARY OF THE INVENTION

The general purpose of the present invention is spot-welding a flexible welding board to battery cells to form a battery pack. Other electrical components or electromechanical components can also be spot-welded to the flexible welding board.

According to one embodiment of the present invention, there is provided an automated process for spot-welding a flexible welding board to battery cells, including at least two spot-welders for alternately welding, at least two different location, each end of a battery cell to a flexible welding board, assuring electrical and electromechanical weld integrity. In one example, the battery cell and welding board are spot-welded by a triangular configuration of a negative electrode and two positive electrodes, each of the positive electrodes connected to independent sources of welding power and energized independently of each other for assurance of separate welds. This provides that there are two separate spot-welds and also provides for the integrity of each of the spot-welds.

Significant aspects and features of the present invention include a process for spot-welding, particularly for spot-welding a nickel alloy flexible welding board to a plurality of battery cells. The process is particularly and ideally suited for automated manufacturing of NiCad battery packs.

Another significant aspect and feature of the present invention is a process for spot-welding a flexible welding board to a battery cell, which is completely automated to expedite the manufacturing of battery packs.

Having thus described the embodiments of the present invention, it is a principle object hereof to provide a process and apparatus for spot-welding a flexible welding board to battery cells to form a battery pack, such as a NiCad battery pack.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
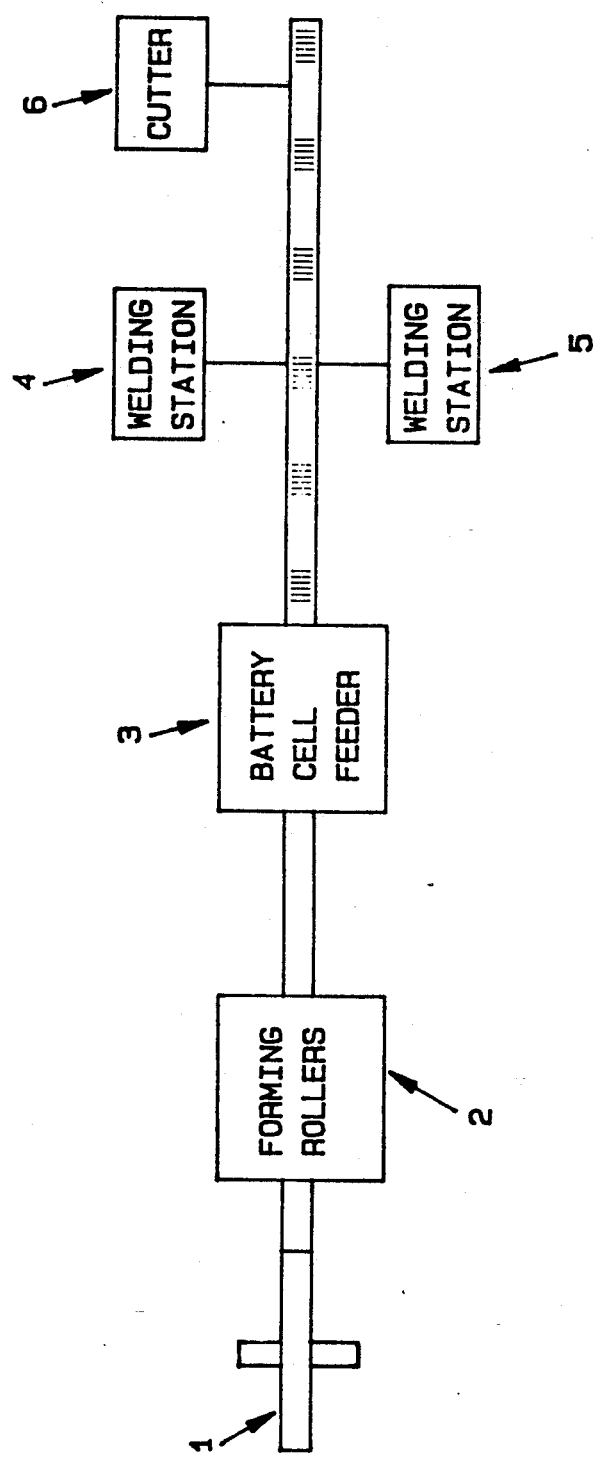
FIG. 1 illustrates a top view of a process and apparatus for spot-welding a flexible welding board to a battery cell.

FIG. 1 illustrates an apparatus for and a process of spot-welding a flexible welding board to battery cells to form a battery pack. While the process is intended to weld a plurality of NiCad battery cells to form a NiCad battery pack, any suitable number of cells and types of cells other than NiCad can be utilized in the process. The flexible welding board geometrically conforms to the battery cells prior to welding the electrical contact portion of each cell to the flexible welding board. At least two spot welds are utilized, although any other type of industrial heating could be utilized, other than spot-welding, such as laser welding, electron beam welding, etc. The process of welding the flexible welding board to battery cells is intended for welding either a single flexible welding board about at least one or a plurality of cells, or for use in robotic welding applications.

Figure 2:
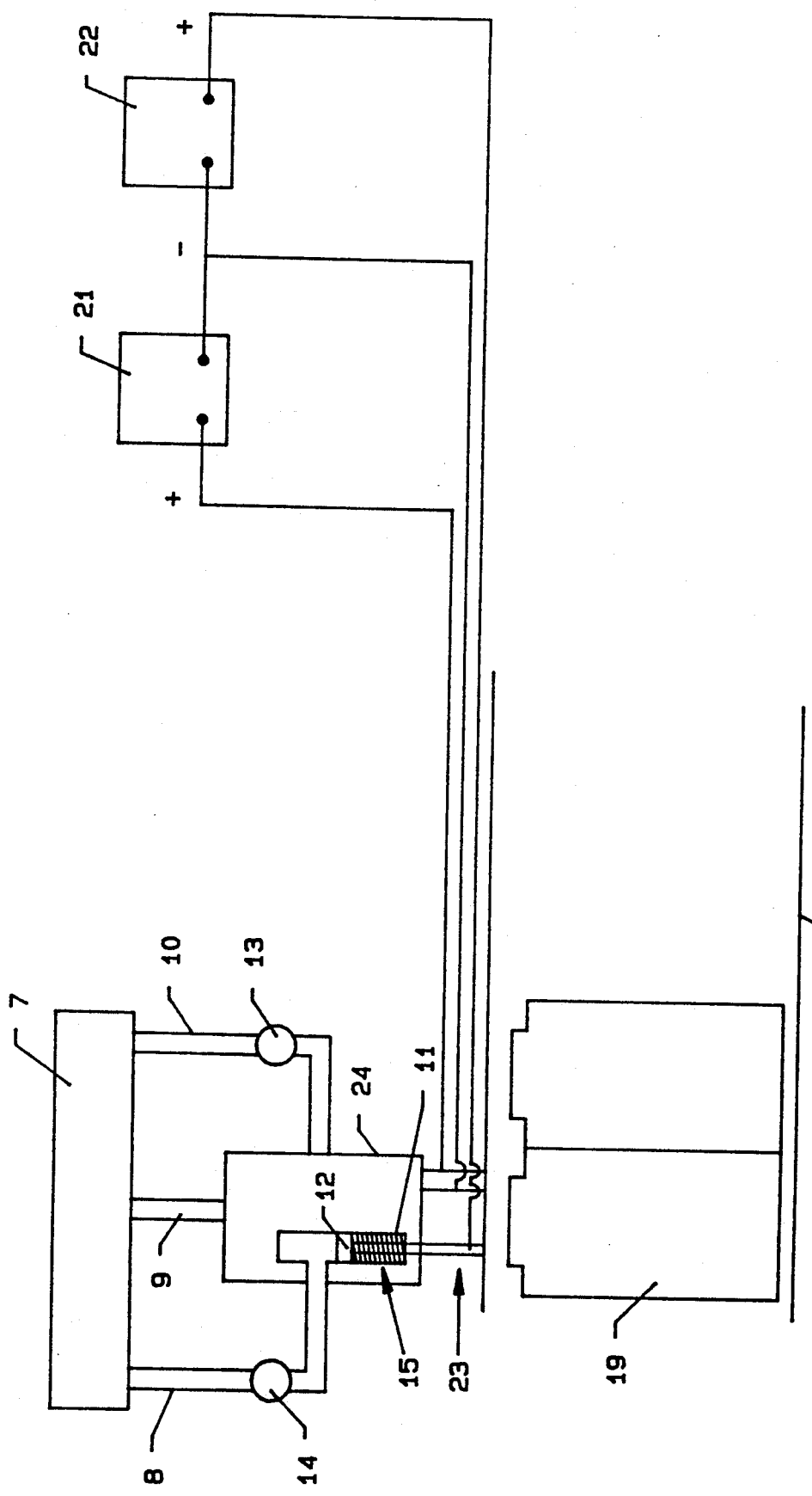
FIG. 2 illustrates an enlarged view of one of the spot welders showing details thereof; and, FIG. 3 illustrates a top view of a flexible welding board formed according to the invention.
Figure 3:
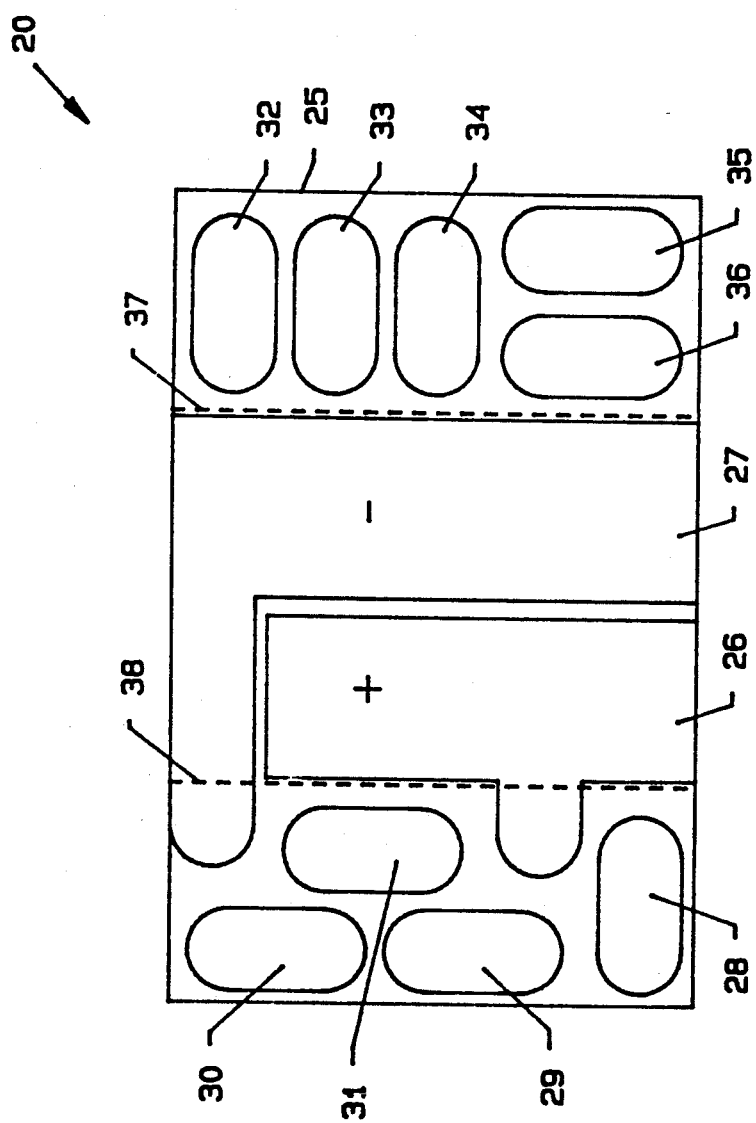

As illustrated on a robotic application, a continuous coil of flexible welding boards, formed as will be described in later detail with reference to FIG. 3, is pulled through driven forming rollers 2. The forming rollers 2 convert the flat flexible welding board into a U-shaped configuration with the legs of the U forcing upwards as viewed from above in FIG. 1. The formed flexible welding board then passes underneath a battery cell feeder 3. The battery cell feeder 3 deposits the desired number of cells 19, as shown in FIG. 2 arranged and suitably bonded together, such as by hot glue or adhesive, between the legs of the formed flexible welding board 1 with the terminals facing up and down as viewed in FIG. 1. The formed flexible welding board and battery cells 19 move to welding stations 4 and 5 where the nickel alloy straps and pads, as shown in FIG. 3, are spot-welded to each of the terminals of the battery cells, forming a battery pack. The battery pack passes to a cutter 6 where each individual battery pack is separated from the now continuous formed strip.

FIG. 2 illustrates in greater detail one of the welding stations 4 and 5 shown in FIG. 1. The welding station consists of a fluid pressure source 7 which supplies pressure over lines 8, 9, and 10 through electric valves 13 and 14 and a third valve in supply line 9 not illustrated. Supply lines 8, 9 and 10 connect to three cylinders 11, only one being illustrated, formed in a housing 24. The cylinders 11 are electrically insulated each from the other. Within each cylinder is a piston 12 to which is connected a spot welding electrode 23. A spring 15, below the piston 12, functions to return electrode 23 upon release of pressure by valves in the supply lines. Separate isolated DC power sources 21 and 22 have their negative terminals commonly connected, and then connect to each one of the spot welding electrodes. The positive terminals are connected to the remaining two spot-welding electrodes. The electrodes are arranged in a triangular configuration, although other geometrical configurations can be utilized as contemplated. The electrodes can be energized in pairs or simultaneously as desired. The spot welder system, as illustrated, will provide three distinct spot welds, insuring both mechanical and electrical integrity.

FIG. 3 is a top view of a flexible welding board as generically contemplated by the teachings of the present invention. As illustrated, a flexible polyester sheet 25 is co-extruded with a polymer adhesive on one surface thereof. Nickel alloy contact pads 26 and 27 and nickel alloy battery interconnecting straps 28-36, suitably dimensioned and configured, are then adhesively formed on the flexible polyester sheet 25. One preferred process is to etch the foil patterns by known processes after the nickel alloy has been laminated to the polyester film. Prior to forming the nickel alloy pads and straps, the flexible polyester sheet is provided with apertures at locations coextensive with the pads and straps to provide for welding the nickel alloy material to the battery terminals.

The robotic process includes forming rollers 2, as shown in FIG. 1, which fold the configuration of FIG. 3 along the lines 37 and 38 into a U-shape, which shape is retained by the nickel alloy material. A plurality of cells can now be placed between the legs of the U as by battery cell feeder 3, and bonded by welding stations 4 and 5. The configuration shown in FIG. 3 is suitable for forming a ten cell battery pack. As contemplated by the present invention, the flexible polyester sheet 25 is a continuous sheet with multiple configurations of pads and straps laminated to the sheet to permit continuous processing.

Although a preferred embodiment of the present invention has been disclosed, numerous modifications are possible within the scope of the invention. For example, the forming rollers could be replaced by other forming structure. The flexible welding board and battery cells can be moved continuously along the processing line, and welded by flying spot welders or indexed along the processing line welded by spot welders which need only be moved to accommodate stacked cells. While fluid cylinders are disclosed to activate the welding electrodes, other structure is possible such as magnetic actuators. The spot welding power supplies can be of any suitable type, such as those manufactured by Hughes Aircraft. The flexible welding board shown in FIG. 3 shows only pads and straps for interconnecting battery cells. It is contemplated that other electrical or electromechanical circuit elements, such as switches, resistors, capacitors, diodes, thermistors, thermal switches, contacts, etc. can be connected to the nickel alloy and even adhesively secured to the polyester film as may be required.

Various modifications can be made to the present invention without departing from the apparent scope hereof.

We claim:

1. Process of forming a battery pack comprising the steps of:
    a. forming a continuous substrate with apertures therein;
    b. forming at least one circuit pattern on said continuous substrate over said apertures;
    c. forming the continuous substrate into a U-shaped configuration;
    d. depositing at least one battery cell within the legs of the U;
    e. welding one of said circuit patterns through said apertures to terminals of said at least one cell; and,
    f. separating the welded battery pack from said continuous substrate.

2. Process of claim 1 wherein the welding is spot-welding.

3. Process of claim 1 wherein a plurality of battery cells are welded to said circuit pattern.

4. Process of claim 1 wherein said continuous substrate is nonconductive.

5. Apparatus for manufacturing a battery pack comprising:
    a. means for supplying a flexible welding boards;
    b. means for forming said flexible welding boards into a U-shaped configuration;
    c. means for feeding a battery pack of at least one cell between the legs of one of the U-shaped flexible welding boards; and,
    d. spot welding means for bonding said flexible welding board to the terminals of the said at least one battery cell.

6. The apparatus of claim 5 wherein said spot welder means is a resistance spot welder having at least one electrode.

7. The apparatus of claim 6 wherein said spot welder means includes three electrodes in a triangular configuration.

8. The apparatus of claim 7 wherein said electrodes are supplied from means including two DC power sources having two of the like polarity terminals interconnected.

9. The apparatus of claim 8 including means connecting the interconnected terminals to one of the electrodes, and means connecting the other two electrodes to the two remaining terminals of said DC power sources.

10. Process for spot welding a flexible welding board to at least one battery cell having terminals at opposite ends, comprising the steps of:
    a. providing a flexible nonconducting welding board;
    b. forming apertures in said welding board;
    c. forming an electrical circuit pattern on said welding board and over said apertures on said welding board;
    d. forming said welding board into a U-shape;
    e. orienting a battery cell with respect to said electrical circuit pattern on said welding board and within the legs of said U-shape; and,
    f. spot-welding said electrical circuit on said welding board through said apertures to said terminals of said battery cell.

11. Process of claim 10 comprising spot-welding a plurality of battery cells to said electrical circuit pattern on said welding board.

12. A process of forming a battery pack comprising the steps of:
    a. forming at least one circuit pattern on a continuous substrate;
    b. forming the substrate into a U-shaped configuration;
    c. depositing at least one battery cell within the legs of the U;
    d. welding one of said circuit patterns to terminals of said at least one cell; and,
    e. separating the welded battery pack from said continuous substrate.

* * * * *